United States Patent
Moon

(10) Patent No.: US 7,119,021 B2
(45) Date of Patent: Oct. 10, 2006

(54) FERROELECTRIC CAPACITOR DEVICES AND A METHOD FOR COMPENSATING FOR DAMAGE TO A CAPACITOR CAUSED BY ETCHING

(75) Inventor: Bum-Ki Moon, Tokyo-to (JP)

(73) Assignee: Infineon Technologies AG, Munich ( * ) Notice: Subject to any disclaimer, the term of this patent is extended or adjusted under 35 U.S.C. 154(b) by 201 days.

(21) Appl. No.: 10/703,870

(22) Filed: Nov. 7, 2003

(65) Prior Publication Data

US 2005/0101142 A1 May 12, 2005

(51) Int. Cl.
*H01L 21/302* (2006.01)

(52) U.S. Cl. .................. 438/706; 438/253; 438/722

(58) Field of Classification Search .............. 438/706, 438/710, 712, 722, 723, 238, 239, 240, 253–256
See application file for complete search history.

(56) References Cited

U.S. PATENT DOCUMENTS

| | | | |
|---|---|---|---|
| 5,638,319 A * | 6/1997 | Onishi et al. ............... | 365/145 |
| 5,745,336 A | 4/1998 | Saito et al. | |
| 5,817,170 A | 10/1998 | Desu et al. | |
| 6,333,066 B1 | 12/2001 | Kim | |
| 6,492,222 B1 * | 12/2002 | Xing .......................... | 438/240 |
| 6,600,185 B1 * | 7/2003 | Tani et al. .................. | 257/296 |
| 6,603,161 B1 * | 8/2003 | Kanaya et al. .............. | 257/295 |
| 6,656,748 B1 * | 12/2003 | Hall et al. ................... | 438/3 |
| 6,773,930 B1 * | 8/2004 | Summerfelt et al. ........... | 438/3 |
| 6,887,716 B1 * | 5/2005 | Fox et al. ..................... | 438/3 |
| 2003/0133250 A1 | 7/2003 | Norga et al. | |
| 2004/0169210 A1 * | 9/2004 | Hornik et al. .............. | 257/295 |
| 2005/0054122 A1 * | 3/2005 | Celii et al. ..................... | 438/3 |

FOREIGN PATENT DOCUMENTS

DE  101 52 636  1/2003

OTHER PUBLICATIONS

C. H. Ahn, et al., "Ferroelectric field effect in ultrathin SrRuO$_3$ films", *Appl. Phys. Lett.*, 70(2):206-208, Jan. 13, 1997.

* cited by examiner

Primary Examiner—Kin-Chan Chen
(74) Attorney, Agent, or Firm—Fish & Richardson P.C.

(57) ABSTRACT

A ferroelectric capacitor in which damage caused by etching exposed faces of a ferroelectric layer of the capacitor is compensated by depositing a seeding layer of ferroelectric material such as PZT on one or more exposed faces of the ferroelectric layer and depositing an electrode layer made of conductive material such as platinum on the seeding layer. An oxygen annealing recovery process is applied to the device. The seeding layer can transform the phase of the damaged surfaces from amorphous to crystalline during the recovery annealing process and, at the same time, provide the damaged surfaces of the ferroelectric layer with missing element(s), for example lead. The oxygen necessary for recovery of the damage may be obtained through the platinum layer from the oxygen atmosphere.

9 Claims, 1 Drawing Sheet

FERROELECTRIC CAPACITOR DEVICES AND A METHOD FOR COMPENSATING FOR DAMAGE TO A CAPACITOR CAUSED BY ETCHING

FIELD OF THE INVENTION

The present invention relates to ferroelectric capacitor devices such as FeRAM devices, and a method for compensating for damage to a capacitor caused by etching.

BACKGROUND OF THE INVENTION

In general terms, ferroelectric capacitors are comprised of a ferroelectric layer sandwiched between two electrodes. The ferroelectric layer may be comprised of, for example, PZT, SBT or BLT. For horizontal ferroelectric capacitors, the layers are stacked in a horizontal manner starting with a lower electrode at the bottom followed by the ferroelectric layer and an upper electrode at the top. On the other hand, for a vertical ferroelectric capacitor structure, the electrodes are arranged vertically with the ferroelectric layer between two vertical electrodes A cross-sectional view of a conventional vertical ferroelectric capacitor is illustrated in FIG. 1. The vertical ferroelectric capacitor 1 includes a stack 20 comprised of a ferroelectric layer 2 sandwiched between a bottom insulating layer 4 and a top insulating layer 6, the vertical electrodes 16 (only one of which is shown in FIG. 1) are located on the sidewalls of the stack. The capacitor structure 1 is mounted on a substrate. In FIG. 1, the substrate is comprised of an interlayer dielectric layer 8 deposited over a semi-conductor substrate 10 such as Si. The semiconductor substrate 10 can be prepared with electrical components such as CMOS devices and the capacitor structure is connected to these devices via contact plugs (not shown) formed in the interlayer dielectric layer. Alternatively, the capacitor can also be formed on the semiconductor substrate without an interlayer dielectric layer. As shown in FIG. 1, the capacitor 1 is covered with an interlayer dielectric hard mask 12, normally Tetraethyl Orthosilicate (TEOS), and the capacitor is shaped according to the hard mask using an RIE (reactive ion etch) process to define the shape of the capacitor. As the etching process cuts through the ferroelectric layer 2, the side faces 14 of the capacitor exposed by the etching process are damaged by the etching gas and the ions. In particular, near the faces 14 exposed by etching, the ferroelectric layer will lose oxygen and maybe lead, and it may also change phase from crystalline to amorphous. Both of these defects are detrimental to the characteristics of the capacitor, and especially so for the vertical capacitor where the area exposed to the etching process is larger.

The conventional method of compensating for such damage is to deposit the electrodes 16, comprised of conductive material such as platinum, over the damaged surfaces 14 (only one of which is shown in FIG. 1) after the etching process. The device 1 is then heated in an oxygen atmosphere using a recovery annealing process. Oxygen seeps through the platinum layer 16 into the damaged wall faces 14 of the ferroelectric layer 2 and replaces the oxygen lost in the etching process and tends to reverse the phase change. However, there is no replacement for the loss of other elements, such as lead, so the compensation is only partial.

In view of the foregoing problems with conventional processes and devices, a need exists for a method for improved compensation for damage to a capacitor during the RIE process.

SUMMARY OF THE INVENTION

In general terms, the present invention includes of an additional ferroelectric seeding layer deposited on one or more exposed faces of the ferroelectric layer of the capacitor which may have been damaged during the etching process. An electrode layer formed of an electrically conductive material, such as platinum, is then deposited on the seeding layer.

The seeding layer is preferably formed of PZT, lead or a combination of PZT and titanium.

The capacitor is subjected to an oxygen annealing recovery process during which the seeding layer can transform the phase of the damaged face from amorphous to crystalline and provide the damaged face of the ferroelectric layer with missing element(s), for example lead. The oxygen necessary for recovery of the damage may be obtained through the electrode layer from the oxygen atmosphere. Thus, the present invention may compensate effectively for composition and crystallinity damage to the ferroelectric layer.

According to a first aspect of the present invention there is provided a method for compensating for damage to a capacitor caused by etching one or more exposed faces of a ferroelectric layer of the capacitor, the capacitor comprising a first electrode, a second electrode, and interlayer dielectric layer formed on a substrate, said first electrode being formed on said interlayer dielectric layer, said ferroelectric layer being located between said first electrode and said second electrode, the method comprising the steps of:
  depositing a seeding layer of ferroelectric material on said one or more exposed faces of said ferroelectric layer;
  depositing a layer of material on said seeding layer; and
  applying an oxygen annealing recovery process to said capacitor.

According to a second aspect of the present invention there is provided a ferroelectric capacitor device formed according to the above-defined method.

According to a third aspect of the present invention there is provided an FeRAM device formed according to the above-defined method.

According to a fourth aspect of the present invention there is provided a ferroelectric capacitor device comprising:
  a substrate;
  a first electrode;
  a second electrode;
  an interlayer dielectric layer formed on said substrate, said first electrode being formed on said interlayer dielectric layer;
  a ferroelectric layer formed between said first electrode and said second electrode, said ferroelectric layer having one or more surfaces exposed by etching;
  a seeding layer of ferroelectric material formed on said one or more exposed surfaces of said ferroelectric layer; and
  a further layer of material formed on said seeding layer.

According to a fifth aspect of the present invention there is provided an FeRAM device comprising one or more of the ferroelectric capacitor devices defined above.

BRIEF DESCRIPTION OF THE DRAWINGS

Preferred features of the invention will now be described, for the sake of illustration only, with reference to the following Figures in which.

DETAILED DESCRIPTION OF PREFERRED EMBODIMENTS

Figure 1:
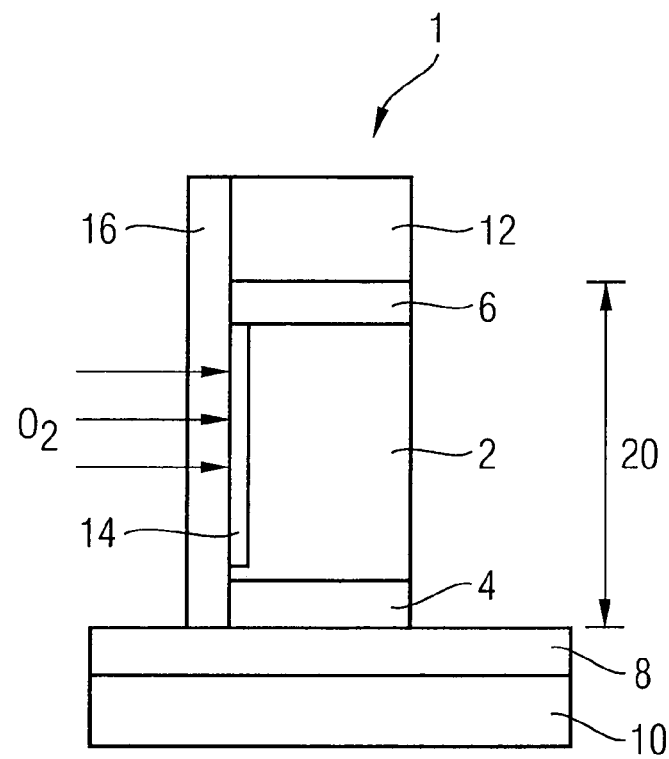
FIG. 1 shows a schematic partial cross-section through a conventional ferroelectric capacitor being subjected to a conventional oxygen annealing process to compensate for damage received during etching.

The method and device which illustrate an embodiment of the invention will be explained with reference to FIG. 2, The elements of the capacitor structure 17 illustrated in FIG. 2 which correspond exactly to elements in the capacitor 1 shown in FIG. 1 are allotted the same reference numerals.

Figure 2:
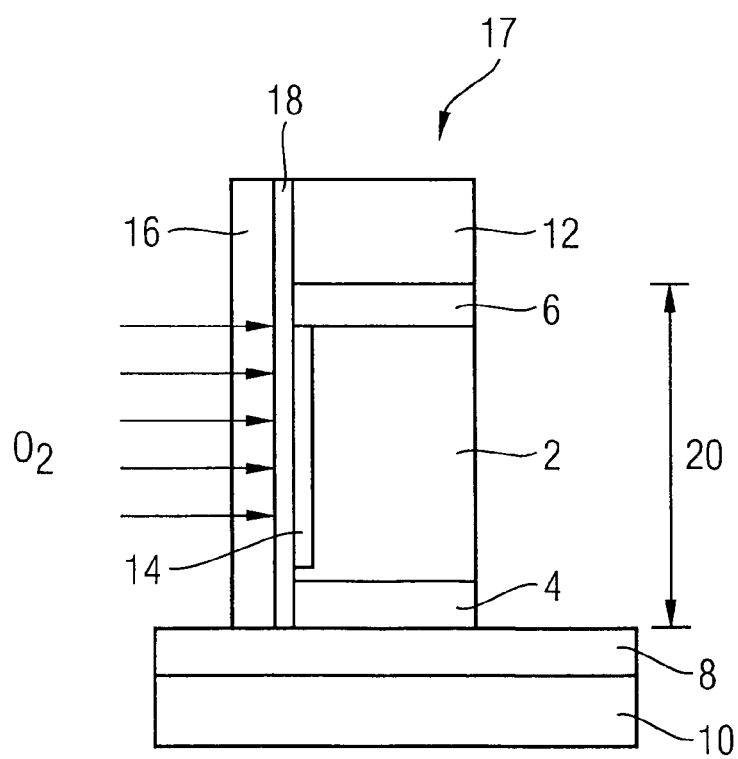
FIG. 2 shows a schematic partial cross-section through a ferroelectric capacitor with damage compensation according to an embodiment of the invention.

In the embodiment shown in FIG. 2, a layer 18 of ferroelectric material, such as PZT, lead, or a combination of titanium and PZT, is deposited over the damaged wall faces 14 of the ferroelectric layer 2. This layer 18 of ferroelectric material acts as a seeding layer and may be deposited using, for example, a metal organic chemical vapour deposition (MOCVD) sputtering process. An electrode layer 16 formed of an electrically conductive material such as platinum is then deposited over the outer surface of this seeding layer 18.

The next stage in the process is recovery annealing in an oxygen atmosphere using RTA (rapid thermal annealing techniques) or a furnace. In one embodiment, Pt is used as the electrode layer 16. As the platinum layer 16 shows crystalline properties (generally larger (111) orientation), the seeding layer 18 can transform the phase of the damaged wall face(s) 14 from amorphous to crystalline during the recovery annealing process and, at the same time, provide the damaged surfaces 14 of the ferroelectric layer 2 with missing element(s), for example lead. The oxygen necessary for recovery of the damage may be obtained through the platinum layer 16 from the oxygen atmosphere. Thus the present invention may compensate for composition and crystallinity damage to the ferroelectric layer 2.

The systems and methods according to the present invention may be particularly useful in the production of devices for use, for example, as ferroelectric random access memories, in particular devices formed of one or more vertical ferroelectric capacitors in which the electrodes are arranged vertically with a ferroelectric layer between the two vertical electrodes. Such devices are particularly prone to damage because a larger surface area of the ferroelectric layer is exposed to the etching process.

Various modifications to the embodiments of the present invention described above may be made. For example, other materials and method steps can be added or substituted for those above. Thus, although the invention has been described above using particular embodiments, many variations are possible within the scope of the claims, as will be clear to the skilled reader, without departing from the spirit and scope of the invention.

The invention claimed is:

1. A method for compensating for damage to a vertical capacitor caused by etching one or more exposed faces of a ferroelectric layer of the vertical capacitor, the vertical capacitor comprising of a first and second electrode with said ferroelectric layer located between said first and second electrode, the method comprising the steps of:
    depositing a seeding layer of ferroelectric material on said one or more exposed faces of said ferroelectric layer, the seeding layer comprising at least one element removed from the ferroelectric layer by said etching and being arranged to be provide the faces of the ferroelectric layer with said at least one element and to transform the phase of the faces of the ferroelectric layer from amorphous to crystalline;
    depositing said first electrode on said seeding layer, said electrode being made of conductive material; and
    applying an oxygen annealing recovery process to said capacitor wherein during said oxygen annealing recovery process and said seeding layer compensates for etching damage in said ferroelectric layer.

2. A method according to claim 1, wherein the step of depositing a seeding layer of ferroelectric material comprises depositing a layer of PZT.

3. A method according to claim 1, wherein the step of depositing a seeding layer of ferroelectric material comprises depositing a layer of a combination of titanium and PZT.

4. A method according to claim 1, wherein the step of depositing a seeding layer of ferroelectric material comprises depositing said seeding layer using a sputtering process.

5. A method according to claim 1, wherein the step of depositing a seeding layer of ferroelectric material using a sputtering process comprises using a metal organic chemical vapour deposition (MOCVD) sputtering process.

6. A method according to claim 1, wherein the step of depositing said first electrode on said seeding layer comprises depositing a layer of platinum.

7. A method according to claim 1, wherein the step of applying an oxygen annealing recovery process comprises applying a rapid thermal annealing (RTA) process.

8. A method according to claim 1, wherein the step of applying an oxygen annealing recovery process comprises applying said process in a furnace.

9. A method for compensating for damage to a capacitor caused by etching one or more exposed faces of a ferroelectric layer of the capacitor, the capacitor comprising of a first and second electrode with said ferroelectric layer located between said first and second electrode, the method comprising the steps of:
    depositing a seeding layer of ferroelectric material on said one or more exposed faces of said ferroelectric layer;
    depositing said first electrode on said seeding layer, said electrode being made of conductive material; and
    applying an oxygen annealing recovery process to said capacitor wherein during said oxygen annealing recovery process said seeding layer compensates for etching damage in said ferroelectric layer, wherein step of depositing a seeding layer of ferroelectric material comprises depositing a layer of lead.

* * * * *